United States Patent [19]
Kim

[11] Patent Number: 6,064,664
[45] Date of Patent: May 16, 2000

[54] BASE-BAND INTERLEAVER FOR CODE DIVISION MULTIPLE ACCESS MOBILE TELECOMMUNICATION SYSTEM

[75] Inventor: Jung-Sik Kim, Seoul, Rep. of Korea

[73] Assignee: SamSung Electronics Co., Ltd., Kyungki-do, Rep. of Korea

[21] Appl. No.: 08/937,304

[22] Filed: Sep. 22, 1997

[30] Foreign Application Priority Data

Sep. 21, 1996 [KR] Rep. of Korea .................. 199641481

[51] Int. Cl.[7] ...................................................... H04J 13/00
[52] U.S. Cl. ........................................... 370/335; 370/320
[58] Field of Search ..................................... 370/310–320, 370/321, 332, 335; 714/701, 702

[56] References Cited

U.S. PATENT DOCUMENTS

| | | |
|---|---|---|
| 4,394,642 | 7/1983 | Currie et al. . |
| 4,559,625 | 12/1985 | Berlekamp et al. . |
| 4,677,626 | 6/1987 | Betts et al. . |
| 4,742,517 | 5/1988 | Takagi et al. . |
| 5,042,033 | 8/1991 | Costa . |
| 5,056,112 | 10/1991 | Wei . |
| 5,063,533 | 11/1991 | Erhart et al. . |
| 5,136,588 | 8/1992 | Ishijima . |
| 5,241,563 | 8/1993 | Paik et al. . |
| 5,276,827 | 1/1994 | Delaruelle et al. . |
| 5,535,220 | 7/1996 | Kanno et al. . |
| 5,537,420 | 7/1996 | Huang . |
| 5,636,224 | 6/1997 | Voith et al. . |
| 5,659,580 | 8/1997 | Partyka . |
| 5,898,698 | 4/1999 | Bross .................................. 714/701 |

FOREIGN PATENT DOCUMENTS

| | | |
|---|---|---|
| 0 715 416 | 6/1996 | European Pat. Off. . |
| 0 715 432 | 6/1996 | European Pat. Off. . |
| 2 294 616 | 5/1996 | United Kingdom . |

OTHER PUBLICATIONS

Rikkinen et al. "A Data Transmission Method, CDMA Transmitter, and CDMA Receiver" abstract Jun. 15, 1995.

*Primary Examiner*—Dang Ton
*Assistant Examiner*—Eva Tang
*Attorney, Agent, or Firm*—Robert E. Bushnell, Esq.

[57] ABSTRACT

A base-band interleaver for forward traffic and paging channel for CDMA mobile telecommunication system with reduced memory size for data interleaving and more simplified construction. Modulo-16 circuit divides an index by a numeral 16, the index being a selected one of successive indexes 0 to 383 corresponding to input data, and provides a remainder. Bit invertor makes bit inversion of an output from the modulo-16 circuit and determines a column position to write in the data with interleaving taken. Quotient-16 circuit produces a quotient of dividing of the index by the numeral 16. Code converter has a row table by which the quotient is respectively matched to a row position to be written with interleaving taken, for generating a row position corresponding to the quotient. 24-based counter provides a 24-based counted value corresponding to a selected row of output data to read out. 16-based counter provides a 16-based counted value corresponding to a selected column of output data to read out. Memory has an interleaving table inclusive of 32 rows and 16 columns, the input data being written to a selected position of the interleaving table according to an output of the bit invertor and an output of the code converter, the output data being data read out from a position corresponding to the output of the 16-based counter and the output of the 24-based counter.

1 Claim, 13 Drawing Sheets

| COLUMN\ROW | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 0 | 8 | 4 | 12 | 2 | 10 | 6 | 14 | 1 | 9 | 5 | 13 | 3 | 11 | 7 | 15 |
| 1 | 64 | 72 | 68 | 76 | 66 | 74 | 70 | 78 | 65 | 73 | 69 | 77 | 67 | 75 | 71 | 79 |
| 2 | 128 | 136 | 132 | 140 | 130 | 138 | 134 | 142 | 129 | 137 | 133 | 141 | 131 | 139 | 135 | 143 |
| 3 | 192 | 200 | 196 | 204 | 194 | 202 | 198 | 206 | 193 | 201 | 197 | 205 | 195 | 203 | 199 | 207 |
| 4 | 256 | 264 | 260 | 268 | 258 | 266 | 262 | 270 | 257 | 265 | 261 | 269 | 259 | 267 | 263 | 271 |
| 5 | 320 | 328 | 324 | 332 | 322 | 330 | 326 | 334 | 321 | 329 | 325 | 333 | 323 | 331 | 327 | 335 |
| 6 | 32 | 40 | 36 | 44 | 34 | 42 | 38 | 46 | 33 | 41 | 37 | 45 | 35 | 43 | 39 | 47 |
| 7 | 96 | 104 | 100 | 108 | 98 | 106 | 102 | 110 | 97 | 105 | 101 | 109 | 99 | 107 | 103 | 111 |
| 8 | 160 | 168 | 164 | 172 | 162 | 170 | 166 | 174 | 161 | 169 | 165 | 173 | 163 | 171 | 167 | 175 |
| 9 | 224 | 232 | 228 | 236 | 226 | 234 | 230 | 238 | 225 | 233 | 229 | 237 | 227 | 235 | 231 | 239 |
| 10 | 288 | 296 | 292 | 300 | 290 | 298 | 294 | 302 | 289 | 297 | 293 | 301 | 291 | 299 | 295 | 303 |
| 11 | 352 | 360 | 356 | 364 | 354 | 362 | 358 | 366 | 353 | 361 | 357 | 365 | 355 | 363 | 359 | 367 |
| 12 | 16 | 24 | 20 | 28 | 18 | 26 | 22 | 30 | 17 | 25 | 21 | 29 | 19 | 27 | 23 | 31 |
| 13 | 80 | 88 | 84 | 92 | 82 | 90 | 86 | 94 | 81 | 89 | 85 | 93 | 83 | 91 | 87 | 95 |
| 14 | 144 | 152 | 148 | 156 | 146 | 154 | 150 | 158 | 145 | 153 | 149 | 157 | 147 | 155 | 151 | 159 |
| 15 | 208 | 216 | 212 | 220 | 210 | 218 | 214 | 222 | 209 | 217 | 213 | 221 | 211 | 219 | 215 | 223 |
| 16 | 272 | 280 | 276 | 284 | 274 | 282 | 278 | 286 | 273 | 281 | 277 | 285 | 275 | 283 | 279 | 287 |
| 17 | 336 | 344 | 340 | 348 | 338 | 346 | 342 | 350 | 337 | 345 | 341 | 349 | 339 | 347 | 343 | 351 |
| 18 | 48 | 56 | 52 | 60 | 50 | 58 | 54 | 62 | 49 | 57 | 53 | 61 | 51 | 59 | 55 | 63 |
| 19 | 112 | 120 | 116 | 124 | 114 | 122 | 118 | 126 | 113 | 121 | 117 | 125 | 115 | 123 | 119 | 127 |
| 20 | 176 | 184 | 180 | 188 | 178 | 186 | 182 | 190 | 177 | 185 | 181 | 189 | 179 | 187 | 183 | 191 |
| 21 | 240 | 248 | 244 | 252 | 242 | 250 | 246 | 254 | 241 | 249 | 245 | 253 | 243 | 251 | 247 | 255 |
| 22 | 304 | 312 | 308 | 316 | 306 | 314 | 310 | 318 | 305 | 313 | 309 | 317 | 307 | 315 | 311 | 319 |
| 23 | 368 | 376 | 372 | 380 | 370 | 378 | 374 | 382 | 369 | 377 | 373 | 381 | 371 | 379 | 375 | 383 |

|     |     |     |     |     |     |     |     |     |     |     |     |     |     |     |     |
| --- | --- | --- | --- | --- | --- | --- | --- | --- | --- | --- | --- | --- | --- | --- | --- |
| 1   | 25  | 49  | 73  | 97  | 121 | 145 | 169 | 193 | 217 | 241 | 265 | 289 | 313 | 337 | 361 |
| 2   | 26  | 50  | 74  | 98  | 122 | 146 | 170 | 194 | 218 | 242 | 266 | 290 | 314 | 338 | 362 |
| 3   | 27  | 51  | 75  | 99  | 123 | 147 | 171 | 195 | 219 | 243 | 267 | 291 | 315 | 339 | 363 |
| 4   | 28  | 52  | 76  | 100 | 124 | 148 | 172 | 196 | 220 | 244 | 268 | 292 | 316 | 340 | 364 |
| 5   | 29  | 53  | 77  | 101 | 125 | 149 | 173 | 197 | 221 | 245 | 269 | 293 | 317 | 341 | 365 |
| 6   | 30  | 54  | 78  | 102 | 126 | 150 | 174 | 198 | 222 | 246 | 270 | 294 | 318 | 342 | 366 |
| 7   | 31  | 55  | 79  | 103 | 127 | 151 | 175 | 199 | 223 | 247 | 271 | 295 | 319 | 343 | 367 |
| 8   | 32  | 56  | 80  | 104 | 128 | 152 | 176 | 200 | 224 | 248 | 272 | 296 | 320 | 344 | 368 |
| 9   | 33  | 57  | 81  | 105 | 129 | 153 | 177 | 201 | 225 | 249 | 273 | 297 | 321 | 345 | 369 |
| 10  | 34  | 58  | 82  | 106 | 130 | 154 | 178 | 202 | 226 | 250 | 274 | 298 | 322 | 346 | 370 |
| 11  | 35  | 59  | 83  | 107 | 131 | 155 | 179 | 203 | 227 | 251 | 275 | 299 | 323 | 347 | 371 |
| 12  | 36  | 60  | 84  | 108 | 132 | 156 | 180 | 204 | 228 | 252 | 276 | 300 | 324 | 348 | 372 |
| 13  | 37  | 61  | 85  | 109 | 133 | 157 | 181 | 205 | 229 | 253 | 277 | 301 | 325 | 349 | 373 |
| 14  | 38  | 62  | 86  | 110 | 134 | 158 | 182 | 206 | 230 | 254 | 278 | 302 | 326 | 350 | 374 |
| 15  | 39  | 63  | 87  | 111 | 135 | 159 | 183 | 207 | 231 | 255 | 279 | 303 | 327 | 351 | 375 |
| 16  | 40  | 64  | 88  | 112 | 136 | 160 | 184 | 208 | 232 | 256 | 280 | 304 | 328 | 352 | 376 |
| 17  | 41  | 65  | 89  | 113 | 137 | 161 | 185 | 209 | 233 | 257 | 281 | 305 | 329 | 353 | 377 |
| 18  | 42  | 66  | 90  | 114 | 138 | 162 | 186 | 210 | 234 | 258 | 282 | 306 | 330 | 354 | 378 |
| 19  | 43  | 67  | 91  | 115 | 139 | 163 | 187 | 211 | 235 | 259 | 283 | 307 | 331 | 355 | 379 |
| 20  | 44  | 68  | 92  | 116 | 140 | 164 | 188 | 212 | 236 | 260 | 284 | 308 | 332 | 356 | 380 |
| 21  | 45  | 69  | 93  | 117 | 141 | 165 | 189 | 213 | 237 | 261 | 285 | 309 | 333 | 357 | 381 |
| 22  | 46  | 70  | 94  | 118 | 142 | 166 | 190 | 214 | 238 | 262 | 286 | 310 | 334 | 358 | 382 |
| 23  | 47  | 71  | 95  | 119 | 143 | 167 | 191 | 215 | 239 | 263 | 287 | 311 | 335 | 359 | 383 |
| 24  | 48  | 72  | 96  | 120 | 144 | 168 | 192 | 216 | 240 | 264 | 288 | 312 | 336 | 360 | 384 |

ROW / COLUMN

| COLUMN | | | | | | | | | | | | | | | |
|---|---|---|---|---|---|---|---|---|---|---|---|---|---|---|---|
| 1 | 13 | 25 | 37 | 49 | 61 | 73 | 85 | 97 | 109 | 121 | 133 | 145 | 157 | 169 | 181 |
| 1 | 13 | 25 | 37 | 49 | 61 | 73 | 85 | 97 | 109 | 121 | 133 | 145 | 157 | 169 | 181 |
| 2 | 14 | 26 | 38 | 50 | 62 | 74 | 86 | 98 | 110 | 122 | 134 | 146 | 158 | 170 | 182 |
| 2 | 14 | 26 | 38 | 50 | 62 | 74 | 86 | 98 | 110 | 122 | 134 | 146 | 158 | 170 | 182 |
| 3 | 15 | 27 | 39 | 51 | 63 | 75 | 87 | 99 | 111 | 123 | 135 | 147 | 159 | 171 | 183 |
| 3 | 15 | 27 | 39 | 51 | 63 | 75 | 87 | 99 | 111 | 123 | 135 | 147 | 159 | 171 | 183 |
| 4 | 16 | 28 | 40 | 52 | 64 | 76 | 88 | 100 | 112 | 124 | 136 | 148 | 160 | 172 | 184 |
| 4 | 16 | 28 | 40 | 52 | 64 | 76 | 88 | 100 | 112 | 124 | 136 | 148 | 160 | 172 | 184 |
| 5 | 17 | 29 | 41 | 53 | 65 | 77 | 89 | 101 | 113 | 125 | 137 | 149 | 161 | 173 | 185 |
| 5 | 17 | 29 | 41 | 53 | 65 | 77 | 89 | 101 | 113 | 125 | 137 | 149 | 161 | 173 | 185 |
| 6 | 18 | 30 | 42 | 54 | 66 | 78 | 90 | 102 | 114 | 126 | 138 | 150 | 162 | 174 | 186 |
| 6 | 18 | 30 | 42 | 54 | 66 | 78 | 90 | 102 | 114 | 126 | 138 | 150 | 162 | 174 | 186 |
| 7 | 19 | 31 | 43 | 55 | 67 | 79 | 91 | 103 | 115 | 127 | 139 | 151 | 163 | 175 | 187 |
| 7 | 19 | 31 | 43 | 55 | 67 | 79 | 91 | 103 | 115 | 127 | 139 | 151 | 163 | 175 | 187 |
| 8 | 20 | 32 | 44 | 56 | 68 | 80 | 92 | 104 | 116 | 128 | 140 | 152 | 164 | 176 | 188 |
| 8 | 20 | 32 | 44 | 56 | 68 | 80 | 92 | 104 | 116 | 128 | 140 | 152 | 164 | 176 | 188 |
| 9 | 21 | 33 | 45 | 57 | 69 | 81 | 93 | 105 | 117 | 129 | 141 | 153 | 165 | 177 | 189 |
| 9 | 21 | 33 | 45 | 57 | 69 | 81 | 93 | 105 | 117 | 129 | 141 | 153 | 165 | 177 | 189 |
| 10 | 22 | 34 | 46 | 58 | 70 | 82 | 94 | 106 | 118 | 130 | 142 | 154 | 166 | 178 | 190 |
| 10 | 22 | 34 | 46 | 58 | 70 | 82 | 94 | 106 | 118 | 130 | 142 | 154 | 166 | 178 | 190 |
| 11 | 23 | 35 | 47 | 59 | 71 | 83 | 95 | 107 | 119 | 131 | 143 | 155 | 167 | 179 | 191 |
| 11 | 23 | 35 | 47 | 59 | 71 | 83 | 95 | 107 | 119 | 131 | 143 | 155 | 167 | 179 | 191 |
| 12 | 24 | 36 | 48 | 60 | 72 | 84 | 96 | 108 | 120 | 132 | 144 | 156 | 168 | 180 | 192 |
| 12 | 24 | 36 | 48 | 60 | 72 | 84 | 96 | 108 | 120 | 132 | 144 | 156 | 168 | 180 | 192 |

ROW

| COLUMN | | | | | | | | | | | | | | | |
|---|---|---|---|---|---|---|---|---|---|---|---|---|---|---|---|
| 1 | 5 | 3 | 7 | 2 | 6 | 4 | 8 | 1 | 5 | 3 | 7 | 2 | 6 | 4 | 8 |
| 33 | 37 | 35 | 39 | 34 | 38 | 36 | 40 | 33 | 37 | 35 | 39 | 34 | 38 | 36 | 40 |
| 65 | 69 | 67 | 71 | 66 | 70 | 68 | 72 | 65 | 69 | 67 | 71 | 66 | 70 | 68 | 72 |
| 97 | 101 | 99 | 103 | 98 | 102 | 100 | 104 | 97 | 101 | 99 | 103 | 98 | 102 | 100 | 104 |
| 129 | 133 | 131 | 135 | 130 | 134 | 132 | 136 | 129 | 133 | 131 | 135 | 130 | 134 | 132 | 136 |
| 161 | 165 | 163 | 167 | 162 | 166 | 164 | 168 | 161 | 165 | 163 | 167 | 162 | 166 | 164 | 168 |
| 17 | 21 | 19 | 23 | 18 | 22 | 20 | 24 | 17 | 21 | 19 | 23 | 18 | 22 | 20 | 24 |
| 49 | 53 | 51 | 55 | 50 | 54 | 52 | 56 | 49 | 53 | 51 | 55 | 50 | 54 | 52 | 56 |
| 81 | 85 | 83 | 87 | 82 | 86 | 84 | 88 | 81 | 85 | 83 | 87 | 82 | 86 | 84 | 88 |
| 113 | 117 | 115 | 119 | 114 | 118 | 116 | 120 | 113 | 117 | 115 | 119 | 114 | 118 | 116 | 120 |
| 145 | 149 | 147 | 151 | 146 | 150 | 148 | 152 | 145 | 149 | 147 | 151 | 146 | 150 | 148 | 152 |
| 177 | 181 | 179 | 183 | 178 | 182 | 180 | 184 | 177 | 181 | 179 | 183 | 178 | 182 | 180 | 184 |
| 9 | 13 | 11 | 15 | 10 | 14 | 12 | 16 | 9 | 13 | 11 | 15 | 10 | 14 | 12 | 16 |
| 41 | 45 | 43 | 47 | 42 | 46 | 44 | 48 | 41 | 45 | 43 | 47 | 42 | 46 | 44 | 48 |
| 73 | 77 | 75 | 79 | 74 | 78 | 76 | 80 | 73 | 77 | 75 | 79 | 74 | 78 | 76 | 80 |
| 105 | 109 | 107 | 111 | 106 | 110 | 108 | 112 | 105 | 109 | 107 | 111 | 106 | 110 | 108 | 112 |
| 137 | 141 | 139 | 143 | 138 | 142 | 140 | 144 | 137 | 141 | 139 | 143 | 138 | 142 | 140 | 144 |
| 169 | 173 | 171 | 175 | 170 | 174 | 172 | 176 | 169 | 173 | 171 | 175 | 170 | 174 | 172 | 176 |
| 25 | 29 | 27 | 31 | 26 | 30 | 28 | 32 | 25 | 29 | 27 | 31 | 26 | 30 | 28 | 32 |
| 57 | 61 | 59 | 63 | 58 | 62 | 60 | 64 | 57 | 61 | 59 | 63 | 58 | 62 | 60 | 64 |
| 89 | 93 | 91 | 95 | 90 | 94 | 92 | 96 | 89 | 93 | 91 | 95 | 90 | 94 | 92 | 96 |
| 121 | 125 | 123 | 127 | 122 | 126 | 124 | 128 | 121 | 125 | 123 | 127 | 122 | 126 | 124 | 128 |
| 153 | 157 | 155 | 159 | 154 | 158 | 156 | 160 | 153 | 157 | 155 | 159 | 154 | 158 | 156 | 160 |
| 185 | 189 | 187 | 191 | 186 | 190 | 188 | 192 | 185 | 189 | 187 | 191 | 186 | 190 | 188 | 192 |

ROW

FIG. 5

COLUMN

| 91 | 91 | 91 | 91 | 92 | 92 | 92 | 92 | 93 | 93 | 93 | 93 | 94 | 94 | 94 | 94 | 95 | 95 | 95 | 95 | 96 | 96 | 96 | 96 |
|----|----|----|----|----|----|----|----|----|----|----|----|----|----|----|----|----|----|----|----|----|----|----|----|
| 85 | 85 | 85 | 85 | 86 | 86 | 86 | 86 | 87 | 87 | 87 | 87 | 88 | 88 | 88 | 88 | 89 | 89 | 89 | 89 | 90 | 90 | 90 | 90 |
| 79 | 79 | 79 | 79 | 80 | 80 | 80 | 80 | 81 | 81 | 81 | 81 | 82 | 82 | 82 | 82 | 83 | 83 | 83 | 83 | 84 | 84 | 84 | 84 |
| 73 | 73 | 73 | 73 | 74 | 74 | 74 | 74 | 75 | 75 | 75 | 75 | 76 | 76 | 76 | 76 | 77 | 77 | 77 | 77 | 78 | 78 | 78 | 78 |
| 67 | 67 | 67 | 67 | 68 | 68 | 68 | 68 | 69 | 69 | 69 | 69 | 70 | 70 | 70 | 70 | 71 | 71 | 71 | 71 | 72 | 72 | 72 | 72 |
| 61 | 61 | 61 | 61 | 62 | 62 | 62 | 62 | 63 | 63 | 63 | 63 | 64 | 64 | 64 | 64 | 65 | 65 | 65 | 65 | 66 | 66 | 66 | 66 |
| 55 | 55 | 55 | 55 | 56 | 56 | 56 | 56 | 57 | 57 | 57 | 57 | 58 | 58 | 58 | 58 | 59 | 59 | 59 | 59 | 60 | 60 | 60 | 60 |
| 49 | 49 | 49 | 49 | 50 | 50 | 50 | 50 | 51 | 51 | 51 | 51 | 52 | 52 | 52 | 52 | 53 | 53 | 53 | 53 | 54 | 54 | 54 | 54 |
| 43 | 43 | 43 | 43 | 44 | 44 | 44 | 44 | 45 | 45 | 45 | 45 | 46 | 46 | 46 | 46 | 47 | 47 | 47 | 47 | 48 | 48 | 48 | 48 |
| 37 | 37 | 37 | 37 | 38 | 38 | 38 | 38 | 39 | 39 | 39 | 39 | 40 | 40 | 40 | 40 | 41 | 41 | 41 | 41 | 42 | 42 | 42 | 42 |
| 31 | 31 | 31 | 31 | 32 | 32 | 32 | 32 | 33 | 33 | 33 | 33 | 34 | 34 | 34 | 34 | 35 | 35 | 35 | 35 | 36 | 36 | 36 | 36 |
| 25 | 25 | 25 | 25 | 26 | 26 | 26 | 26 | 27 | 27 | 27 | 27 | 28 | 28 | 28 | 28 | 29 | 29 | 29 | 29 | 30 | 30 | 30 | 30 |
| 19 | 19 | 19 | 19 | 20 | 20 | 20 | 20 | 21 | 21 | 21 | 21 | 22 | 22 | 22 | 22 | 23 | 23 | 23 | 23 | 24 | 24 | 24 | 24 |
| 13 | 13 | 13 | 13 | 14 | 14 | 14 | 14 | 15 | 15 | 15 | 15 | 16 | 16 | 16 | 16 | 17 | 17 | 17 | 17 | 18 | 18 | 18 | 18 |
| 7  | 7  | 7  | 7  | 8  | 8  | 8  | 8  | 9  | 9  | 9  | 9  | 10 | 10 | 10 | 10 | 11 | 11 | 11 | 11 | 12 | 12 | 12 | 12 |
| 1  | 1  | 1  | 1  | 2  | 2  | 2  | 2  | 3  | 3  | 3  | 3  | 4  | 4  | 4  | 4  | 5  | 5  | 5  | 5  | 6  | 6  | 6  | 6  |

ROW

| ROW\COLUMN | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| 1 | 1 | 4 | 7 | 10 | 13 | 16 | 19 | 22 | 25 | 28 | 31 | 34 | 37 | 40 | 43 | 46 |
| 2 | 1 | 4 | 7 | 10 | 13 | 16 | 19 | 22 | 25 | 28 | 31 | 34 | 37 | 40 | 43 | 46 |
| 3 | 1 | 4 | 7 | 10 | 13 | 16 | 19 | 22 | 25 | 28 | 31 | 34 | 37 | 40 | 43 | 46 |
| 4 | 1 | 4 | 7 | 10 | 13 | 16 | 19 | 22 | 25 | 28 | 31 | 34 | 37 | 40 | 43 | 46 |
| 5 | 1 | 4 | 7 | 10 | 13 | 16 | 19 | 22 | 25 | 28 | 31 | 34 | 37 | 40 | 43 | 46 |
| 6 | 1 | 4 | 7 | 10 | 13 | 16 | 19 | 22 | 25 | 28 | 31 | 34 | 37 | 40 | 43 | 46 |
| 7 | 1 | 4 | 7 | 10 | 13 | 16 | 19 | 22 | 25 | 28 | 31 | 34 | 37 | 40 | 43 | 46 |
| 8 | 1 | 4 | 7 | 10 | 13 | 16 | 19 | 22 | 25 | 28 | 31 | 34 | 37 | 40 | 43 | 46 |
| 9 | 2 | 5 | 8 | 11 | 14 | 17 | 20 | 23 | 26 | 29 | 32 | 35 | 38 | 41 | 44 | 47 |
| 10 | 2 | 5 | 8 | 11 | 14 | 17 | 20 | 23 | 26 | 29 | 32 | 35 | 38 | 41 | 44 | 47 |
| 11 | 2 | 5 | 8 | 11 | 14 | 17 | 20 | 23 | 26 | 29 | 32 | 35 | 38 | 41 | 44 | 47 |
| 12 | 2 | 5 | 8 | 11 | 14 | 17 | 20 | 23 | 26 | 29 | 32 | 35 | 38 | 41 | 44 | 47 |
| 13 | 2 | 5 | 8 | 11 | 14 | 17 | 20 | 23 | 26 | 29 | 32 | 35 | 38 | 41 | 44 | 47 |
| 14 | 2 | 5 | 8 | 11 | 14 | 17 | 20 | 23 | 26 | 29 | 32 | 35 | 38 | 41 | 44 | 47 |
| 15 | 2 | 5 | 8 | 11 | 14 | 17 | 20 | 23 | 26 | 29 | 32 | 35 | 38 | 41 | 44 | 47 |
| 16 | 2 | 5 | 8 | 11 | 14 | 17 | 20 | 23 | 26 | 29 | 32 | 35 | 38 | 41 | 44 | 47 |
| 17 | 3 | 6 | 9 | 12 | 15 | 18 | 21 | 24 | 27 | 30 | 33 | 36 | 39 | 42 | 45 | 48 |
| 18 | 3 | 6 | 9 | 12 | 15 | 18 | 21 | 24 | 27 | 30 | 33 | 36 | 39 | 42 | 45 | 48 |
| 19 | 3 | 6 | 9 | 12 | 15 | 18 | 21 | 24 | 27 | 30 | 33 | 36 | 39 | 42 | 45 | 48 |
| 20 | 3 | 6 | 9 | 12 | 15 | 18 | 21 | 24 | 27 | 30 | 33 | 36 | 39 | 42 | 45 | 48 |
| 21 | 3 | 6 | 9 | 12 | 15 | 18 | 21 | 24 | 27 | 30 | 33 | 36 | 39 | 42 | 45 | 48 |
| 22 | 3 | 6 | 9 | 12 | 15 | 18 | 21 | 24 | 27 | 30 | 33 | 36 | 39 | 42 | 45 | 48 |
| 23 | 3 | 6 | 9 | 12 | 15 | 18 | 21 | 24 | 27 | 30 | 33 | 36 | 39 | 42 | 45 | 48 |
| 24 | 3 | 6 | 9 | 12 | 15 | 18 | 21 | 24 | 27 | 30 | 33 | 36 | 39 | 42 | 45 | 48 |

FIG. 8

COLUMN

| 1 | 9 | 17 | 25 | 33 | 41 | 5 | 13 | 21 | 29 | 37 | 45 | 3 | 11 | 19 | 27 | 35 | 43 | 7 | 15 | 23 | 31 | 39 | 47 |
|---|---|----|----|----|----|---|----|----|----|----|----|---|----|----|----|----|----|---|----|----|----|----|----|
| 2 | 10 | 18 | 26 | 34 | 42 | 6 | 14 | 22 | 30 | 38 | 46 | 4 | 12 | 20 | 28 | 36 | 44 | 8 | 16 | 24 | 32 | 40 | 48 |
| 1 | 9 | 17 | 25 | 33 | 41 | 5 | 13 | 21 | 29 | 37 | 45 | 3 | 11 | 19 | 27 | 35 | 43 | 7 | 15 | 23 | 31 | 39 | 47 |
| 2 | 10 | 18 | 26 | 34 | 42 | 6 | 14 | 22 | 30 | 38 | 46 | 4 | 12 | 20 | 28 | 36 | 44 | 8 | 16 | 24 | 32 | 40 | 48 |
| 1 | 9 | 17 | 25 | 33 | 41 | 5 | 13 | 21 | 29 | 37 | 45 | 3 | 11 | 19 | 27 | 35 | 43 | 7 | 15 | 23 | 31 | 39 | 47 |
| 2 | 10 | 18 | 26 | 34 | 42 | 6 | 14 | 22 | 30 | 38 | 46 | 4 | 12 | 20 | 28 | 36 | 44 | 8 | 16 | 24 | 32 | 40 | 48 |
| 1 | 9 | 17 | 25 | 33 | 41 | 5 | 13 | 21 | 29 | 37 | 45 | 3 | 11 | 19 | 27 | 35 | 43 | 7 | 15 | 23 | 31 | 39 | 47 |
| 2 | 10 | 18 | 26 | 34 | 42 | 6 | 14 | 22 | 30 | 38 | 46 | 4 | 12 | 20 | 28 | 36 | 44 | 8 | 16 | 24 | 32 | 40 | 48 |
| 1 | 9 | 17 | 25 | 33 | 41 | 5 | 13 | 21 | 29 | 37 | 45 | 3 | 11 | 19 | 27 | 35 | 43 | 7 | 15 | 23 | 31 | 39 | 47 |
| 2 | 10 | 18 | 26 | 34 | 42 | 6 | 14 | 22 | 30 | 38 | 46 | 4 | 12 | 20 | 28 | 36 | 44 | 8 | 16 | 24 | 32 | 40 | 48 |
| 1 | 9 | 17 | 25 | 33 | 41 | 5 | 13 | 21 | 29 | 37 | 45 | 3 | 11 | 19 | 27 | 35 | 43 | 7 | 15 | 23 | 31 | 39 | 47 |
| 2 | 10 | 18 | 26 | 34 | 42 | 6 | 14 | 22 | 30 | 38 | 46 | 4 | 12 | 20 | 28 | 36 | 44 | 8 | 16 | 24 | 32 | 40 | 48 |
| 1 | 9 | 17 | 25 | 33 | 41 | 5 | 13 | 21 | 29 | 37 | 45 | 3 | 11 | 19 | 27 | 35 | 43 | 7 | 15 | 23 | 31 | 39 | 47 |
| 2 | 10 | 18 | 26 | 34 | 42 | 6 | 14 | 22 | 30 | 38 | 46 | 4 | 12 | 20 | 28 | 36 | 44 | 8 | 16 | 24 | 32 | 40 | 48 |
| 1 | 9 | 17 | 25 | 33 | 41 | 5 | 13 | 21 | 29 | 37 | 45 | 3 | 11 | 19 | 27 | 35 | 43 | 7 | 15 | 23 | 31 | 39 | 47 |
| 2 | 10 | 18 | 26 | 34 | 42 | 6 | 14 | 22 | 30 | 38 | 46 | 4 | 12 | 20 | 28 | 36 | 44 | 8 | 16 | 24 | 32 | 40 | 48 |

ROW

| COLUMN / ROW | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 0 | 24 | 48 | 72 | 96 | 120 | 144 | 168 | 192 | 216 | 240 | 264 | 288 | 312 | 336 | 360 |
| 1 | 1 | 25 | 49 | 73 | 97 | 121 | 145 | 169 | 193 | 217 | 241 | 265 | 289 | 313 | 337 | 361 |
| 2 | 2 | 26 | 50 | 74 | 98 | 122 | 146 | 170 | 194 | 218 | 242 | 266 | 290 | 314 | 338 | 362 |
| 3 | 3 | 27 | 51 | 75 | 99 | 123 | 147 | 171 | 195 | 219 | 243 | 267 | 291 | 315 | 339 | 363 |
| 4 | 4 | 28 | 52 | 76 | 100 | 124 | 148 | 172 | 196 | 220 | 244 | 268 | 292 | 316 | 340 | 364 |
| 5 | 5 | 29 | 53 | 77 | 101 | 125 | 149 | 173 | 197 | 221 | 245 | 269 | 293 | 317 | 341 | 365 |
| 6 | 6 | 30 | 54 | 78 | 102 | 126 | 150 | 174 | 198 | 222 | 246 | 270 | 294 | 318 | 342 | 366 |
| 7 | 7 | 31 | 55 | 79 | 103 | 127 | 151 | 175 | 199 | 223 | 247 | 271 | 295 | 319 | 343 | 367 |
| 8 | 8 | 32 | 56 | 80 | 104 | 128 | 152 | 176 | 200 | 224 | 248 | 272 | 296 | 320 | 344 | 368 |
| 9 | 9 | 33 | 57 | 81 | 105 | 129 | 153 | 177 | 201 | 225 | 249 | 273 | 297 | 321 | 345 | 369 |
| 10 | 10 | 34 | 58 | 82 | 106 | 130 | 154 | 178 | 202 | 226 | 250 | 274 | 298 | 322 | 346 | 370 |
| 11 | 11 | 35 | 59 | 83 | 107 | 131 | 155 | 179 | 203 | 227 | 251 | 275 | 299 | 323 | 347 | 371 |
| 12 | 12 | 36 | 60 | 84 | 108 | 132 | 156 | 180 | 204 | 228 | 252 | 276 | 300 | 324 | 348 | 372 |
| 13 | 13 | 37 | 61 | 85 | 109 | 133 | 157 | 181 | 205 | 229 | 253 | 277 | 301 | 325 | 349 | 373 |
| 14 | 14 | 38 | 62 | 86 | 110 | 134 | 158 | 182 | 206 | 230 | 254 | 278 | 302 | 326 | 350 | 374 |
| 15 | 15 | 39 | 63 | 87 | 111 | 135 | 159 | 183 | 207 | 231 | 255 | 279 | 303 | 327 | 351 | 375 |
| 16 | 16 | 40 | 64 | 88 | 112 | 136 | 160 | 184 | 208 | 232 | 256 | 280 | 304 | 328 | 352 | 376 |
| 17 | 17 | 41 | 65 | 89 | 113 | 137 | 161 | 185 | 209 | 233 | 257 | 281 | 305 | 329 | 353 | 377 |
| 18 | 18 | 42 | 66 | 90 | 114 | 138 | 162 | 186 | 210 | 234 | 258 | 282 | 306 | 330 | 354 | 378 |
| 19 | 19 | 43 | 67 | 91 | 115 | 139 | 163 | 187 | 211 | 235 | 259 | 283 | 307 | 331 | 355 | 379 |
| 20 | 20 | 44 | 68 | 92 | 116 | 140 | 164 | 188 | 212 | 236 | 260 | 284 | 308 | 332 | 356 | 380 |
| 21 | 21 | 45 | 69 | 93 | 117 | 141 | 165 | 189 | 213 | 237 | 261 | 285 | 309 | 333 | 357 | 381 |
| 22 | 22 | 46 | 70 | 94 | 118 | 142 | 166 | 190 | 214 | 238 | 262 | 286 | 310 | 334 | 358 | 382 |
| 23 | 23 | 47 | 71 | 95 | 119 | 143 | 167 | 191 | 215 | 239 | 263 | 287 | 311 | 335 | 359 | 383 |

FIG. 9

| COLUMN ROW | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 0 | 8 | 4 | 12 | 2 | 10 | 6 | 14 | 1 | 9 | 5 | 13 | 3 | 11 | 7 | 15 |
| 1 | 64 | 72 | 68 | 76 | 66 | 74 | 70 | 78 | 65 | 73 | 69 | 77 | 67 | 75 | 71 | 79 |
| 2 | 128 | 136 | 132 | 140 | 130 | 138 | 134 | 142 | 129 | 137 | 133 | 141 | 131 | 139 | 135 | 143 |
| 3 | 192 | 200 | 196 | 204 | 194 | 202 | 198 | 206 | 193 | 201 | 197 | 205 | 195 | 203 | 199 | 207 |
| 4 | 256 | 264 | 260 | 268 | 258 | 266 | 262 | 270 | 257 | 265 | 261 | 269 | 259 | 267 | 263 | 271 |
| 5 | 320 | 328 | 324 | 332 | 322 | 330 | 326 | 334 | 321 | 329 | 325 | 333 | 323 | 331 | 327 | 335 |
| 6 | 32 | 40 | 36 | 44 | 34 | 42 | 38 | 46 | 33 | 41 | 37 | 45 | 35 | 43 | 39 | 47 |
| 7 | 96 | 104 | 100 | 108 | 98 | 106 | 102 | 110 | 97 | 105 | 101 | 109 | 99 | 107 | 103 | 111 |
| 8 | 160 | 168 | 164 | 172 | 162 | 170 | 166 | 174 | 161 | 169 | 165 | 173 | 163 | 171 | 167 | 175 |
| 9 | 224 | 232 | 228 | 236 | 226 | 234 | 230 | 238 | 225 | 233 | 229 | 237 | 227 | 235 | 231 | 239 |
| 10 | 288 | 296 | 292 | 300 | 290 | 298 | 294 | 302 | 289 | 297 | 293 | 301 | 291 | 299 | 295 | 303 |
| 11 | 352 | 360 | 356 | 364 | 354 | 362 | 358 | 366 | 353 | 361 | 357 | 365 | 355 | 363 | 359 | 367 |
| 12 | 16 | 24 | 20 | 28 | 18 | 26 | 22 | 30 | 17 | 25 | 21 | 29 | 19 | 27 | 23 | 31 |
| 13 | 80 | 88 | 84 | 92 | 82 | 90 | 86 | 94 | 81 | 89 | 85 | 93 | 83 | 91 | 87 | 95 |
| 14 | 144 | 152 | 148 | 156 | 146 | 154 | 150 | 158 | 145 | 153 | 149 | 157 | 147 | 155 | 151 | 159 |
| 15 | 208 | 216 | 212 | 220 | 210 | 218 | 214 | 222 | 209 | 217 | 213 | 221 | 211 | 219 | 215 | 223 |
| 16 | 272 | 280 | 276 | 284 | 274 | 282 | 278 | 286 | 273 | 281 | 277 | 285 | 275 | 283 | 279 | 287 |
| 17 | 336 | 344 | 340 | 348 | 338 | 346 | 342 | 350 | 337 | 345 | 341 | 349 | 339 | 347 | 343 | 351 |
| 18 | 48 | 56 | 52 | 60 | 50 | 58 | 54 | 62 | 49 | 57 | 53 | 61 | 51 | 59 | 55 | 63 |
| 19 | 112 | 120 | 116 | 124 | 114 | 122 | 118 | 126 | 113 | 121 | 117 | 125 | 115 | 123 | 119 | 127 |
| 20 | 176 | 184 | 180 | 188 | 178 | 186 | 182 | 190 | 177 | 185 | 181 | 189 | 179 | 187 | 183 | 191 |
| 21 | 240 | 248 | 244 | 252 | 242 | 250 | 246 | 254 | 241 | 249 | 245 | 253 | 243 | 251 | 247 | 255 |
| 22 | 304 | 312 | 308 | 316 | 306 | 314 | 310 | 318 | 305 | 313 | 309 | 317 | 307 | 315 | 311 | 319 |
| 23 | 368 | 376 | 372 | 380 | 370 | 378 | 374 | 382 | 369 | 377 | 373 | 381 | 371 | 379 | 375 | 383 |

FIG. 10

| BIT | MODULO 16 | MODULO BIT | | | | INVERTED BIT | | | | COLUMN |
|---|---|---|---|---|---|---|---|---|---|---|
| 0 | 0 | 0 | 0 | 0 | 0 | 0 | 0 | 0 | 0 | 0 |
| 1 | 1 | 0 | 0 | 0 | 1 | 1 | 0 | 0 | 0 | 8 |
| 2 | 2 | 0 | 0 | 1 | 0 | 0 | 1 | 0 | 0 | 4 |
| 3 | 3 | 0 | 0 | 1 | 1 | 1 | 1 | 0 | 0 | 12 |
| 4 | 4 | 0 | 1 | 0 | 0 | 0 | 0 | 1 | 0 | 2 |
| 5 | 5 | 0 | 1 | 0 | 1 | 1 | 0 | 1 | 0 | 10 |
| 6 | 6 | 0 | 1 | 1 | 0 | 0 | 1 | 1 | 0 | 6 |
| 7 | 7 | 0 | 1 | 1 | 1 | 1 | 1 | 1 | 0 | 14 |
| 8 | 8 | 1 | 0 | 0 | 0 | 0 | 0 | 0 | 1 | 1 |
| 9 | 9 | 1 | 0 | 0 | 1 | 1 | 0 | 0 | 1 | 9 |
| 10 | 10 | 1 | 0 | 1 | 0 | 0 | 1 | 0 | 1 | 5 |
| 11 | 11 | 1 | 0 | 1 | 1 | 1 | 1 | 0 | 1 | 13 |
| 12 | 12 | 1 | 1 | 0 | 0 | 0 | 0 | 1 | 1 | 3 |
| 13 | 13 | 1 | 1 | 0 | 1 | 1 | 0 | 1 | 1 | 11 |
| 14 | 14 | 1 | 1 | 1 | 0 | 0 | 1 | 1 | 1 | 7 |
| 15 | 15 | 1 | 1 | 1 | 1 | 1 | 1 | 1 | 1 | 15 |

FIG. 11

| QUOTIENT 16 | ROW | QUOTIENT 16 | ROW |
|---|---|---|---|
| 0 | 0 | 12 | 3 |
| 1 | 12 | 13 | 15 |
| 2 | 6 | 14 | 9 |
| 3 | 18 | 15 | 21 |
| 4 | 1 | 16 | 4 |
| 5 | 13 | 17 | 16 |
| 6 | 7 | 18 | 10 |
| 7 | 19 | 19 | 22 |
| 8 | 2 | 20 | 5 |
| 9 | 14 | 21 | 17 |
| 10 | 8 | 22 | 11 |
| 11 | 20 | 23 | 23 |

BASE-BAND INTERLEAVER FOR CODE DIVISION MULTIPLE ACCESS MOBILE TELECOMMUNICATION SYSTEM

CLAIM FOR PRIORITY

This application makes reference to, incorporates the same herein, and claims all benefits accruing under 35 U.S.C. §119 from an application for BASE-BAND INTERLEAVER FOR CODE DIVISION MULTIPLE ACCESS MOBILE TELECOMMUNICATION SYSTEM earlier filed in the Korean Industrial Property Office on the 21th of Sep. 1996, and there duly assigned Ser. No. 41481/1996, a copy of which application is annexed hereto.

BACKGROUND OF THE INVENTION

1. Technical Field

The present invention relates to an interleaving apparatus or interleaver for a Code Division Multiple Access (CDMA) mobile telecommunication system and, more particularly, to a base-band interleaver for forward traffic and paging channels preferably applicable to an IS-95 CDMA specification of telecommunication system.

2. Related Art

Common air interface (IS-95) standard is a mobile telecommunication standard which uses Code Division Multiple Access (CDMA) for signal transmission over communication channels. CDMA is a form of modulation technique for spread-spectrum multiple-access digital communications. In CDMA, a wide-band frequency channel is shared between several overlapping signals, each characterized by a specific pseudo random binary sequence that spreads the initial spectrum of the data to be transmitted.

In a mobile telecommunication environment, signal strength varies with location and movement of the mobile transmitter/receiver. Signal strength can significantly affect error rates which in turn effect the quality of communication. Due to varying signal strength, mobile telecommunication systems are susceptible to burst errors. Burst errors are groupings of errors that occur in adjacent bits of a data block as compared to errors that are dispersed over an entire block of data. A solution to varying signal strength and burst errors is to utilize an error correction scheme based on encoding and interleaving.

Generally, interleaving is used in conjunction with encoding (e.g., error-correcting codes) in order to lower the error rates of communication channels that are susceptible to burst errors. Interleaving is a technique in which encoded digital data is reordered before transmission in such a manner that any two successive digital data bits in the original data stream are separated by a predetermined distance in the transmitted data stream. Deinterleaving is the reverse of interleaving where data bits are reordered back to their original positions. According to the IS-95 standard, data is encoded and interleaved prior to transmission and decoded and deinterleaved after reception. Such deinterleaving disperses burst errors, which can occur during transmission throughout the data block. This dispersal of bit errors enables the decode to treat the burst errors as if they weie random errors, and maximize the capability of the decoder to correct the errors.

One class of interleavers is known as periodic interleavers, for which the interleaving permutation is a periodic function of time. Examples are block interleavers, which accept data in blocks and perform identical permutations over each data block, and convolutional interleavers have no fixed block structure, but perform a periodic permutation over a semi-infinite sequence of coded symbols. A block interleaver typically takes the coded symbols and writes them by columns into a matrix with rows and columns. The permutation consists of reading these symbols out of the matrix by rows prior to transmission. The deinterleaver then performs the inverse operation. Symbols are written into the deinterleaver by rows and read out by columns. In contrast to block interleavers, convolutional interleavers requires the coded symbols to shift sequentially into a bank of registers with increasing length. With each new code symbol, a commutator switches to a new register and the new code symbol is shifted in while the oldest code symbol in that register is shifted out to the communication channel. The deinterleaver has a similar structure and performs the inverse operation. Exemplars of contemporary block and convolutional interleavers are disclosed in U.S. Pat. No. 4,394,642 for Apparatus For Interleaving And De-Interleaving Data issued to Currie et al., U.S. Pat. No. 4,559,625 for Interleavers For Digital Communications issued to Berlekamp et al., U.S. Pat. No. 4,742,517 for Interleaving Circuit issued to Takagi et al., U.S. Pat. No. 5,042,033 for RAM-hnplemented Convolutional Interleaver issued to Costa, U.S. Pat. No. 5,056,112 for Interleaving In Coded Modulation for Mobile Radio issued to Wei, U.S. Pat. No. 5,136,588 for Interleaving Method And Apparatus issued to Ishijima, U.S. Pat. No. 5,241,563 for Method And Apparatus For Communicating Interleaved Data issued to Paik et al., U.S. Pat. No. 5,276,827 for Data Buffer For The Duration Of Cyclicaly Recurrent Buffer Periods issued to Delaruelle et al., U.S. Pat. No. 5,535,220 for Forward Error Correcting Transmitter And Receiver issued to Kanno et al., U.S. Pat. No. 5,537,420 for Convolutional Interleaver With Reduced Memory Requirements And Address Generator Therefor issued to Huang, U.S. Pat. No. 5,636,224 for Method And Apparatus For Interleave/Deinterleave Addressing In Data Communication Circuits issued to Voith et al., and U.S. Pat. No. 5,659,580 for Data Interleaver For Use With Mobile Communication Systems And Having A Contiguous Counter And An Address Twister issued to Partyka.

Many contemporary interleavers utilize a memory look-up table to determine the proper interleaving address. While the use of look-up table minimizes the processing capability required to generate interleaving addresses. However, the look-up table requires a significant amount of memory and memory space for implementation. Moreover, most contemporary interleavers for forward traffic channel and paging channel in a base-band defined in accordance with the IS-95 CDMA standard require a general-purpose memory of 512 bytes for the look-up table. However, I have noted that the look-up table usually requires only 384 bytes of the 512-byte memory chip, the remaining 128 bytes of memory may become wasteful.

SUMMARY OF THE INVENTION

Accordingly, it is therefore an object of the present invention to provide an improved base-band interleaver for CDMA mobile telecommunication system.

It is also object to provide an improved base-band interleaver for forward traffic channel and paging channel with a simplified circuit construction.

It is another object to provide a base-band interleaver for forward traffic channel and paging channel with reduced interleaving memory capacity.

The above and other objects of the present invention can be achieved by a base-band interleaver for a CDMA mobile telecommunication system provided with a modulo-16 circuit connected to receive an index selected from successive indexes 0 to 383 corresponding to input data to divide the index by a numeral 16, and provide a remainder of the divided index. A bit invertor is connected to the modulo-16 circuit to perform bit inversion of an output from the modulo-16 circuit and determine a column position to write in the data with interleaving taken. A quotient-16 circuit is connected to receive the index to produce a quotient of dividing of the index by the numeral 16. A code converter having a row table by which the quotient is respectively matched to a row position to be written with interleaving taken, to generate a row position corresponding to the quotient. A 24-based counter counts a data read clock to provide a 24-based counted value corresponding to a selected row of output data to read out so as to output the interleaved written data selectively. A 16-based counter receives a carry of the 24-based counter to provide a 16-based counted value corresponding to a selected column of output data to read out. A memory having therein an interleaving table inclusive of 32 rows and 16 columns, is used to store input data written to a selected position of the interleaving table according to the outputs of the bit invertor and the code converter, and to provide therefrom output data read out from the position corresponding to the output of the 16-based counter and the output of the 24-based counter.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIG. 1 illustrates an exemplary input table of 14400 Bps, 9600 Bps, 7200 Bps, 3600 Bps and 1800 Bps for the forward traffic and paging channel interleaver;

FIG. 2 illustrates an exemplary interleaving table of 14400 Bps, 9600 Bps, 7200 Bps, 3600 Bps and 1800 Bps for the forward traffic and paging channel interleaver;

FIG. 3 illustrates an exemplary input table of 4800 Bps for the forward traffic and paging channel interleaver;

FIG. 4 illustrates an exemplary interleaving table of 4800 Bps for the forward traffic and paging channel interleaver;

FIG. 5 illustrates an exemplary input table of 2400 Bps for the forward traffic and paging channel interleaver;

FIG. 6 illustrates an exemplary interleaving table of 2400 Bps for the forward traffic and paging channel interleaver;

FIG. 7 illustrates an exemplary input table of 1200 Bps for the forward traffic and paging channel interleaver;

FIG. 8 illustrates an exemplary interleaving table of 1200 Bps for the forward traffic and paging channel interleaver;

FIG. 9 illustrates an input table of the input data according to a preferred embodiment of the present invention;

FIG. 10 illustrates an interleaving table according to a preferred embodiment of the present invention;

FIG. 11 illustrates a table indicative of the relationship between columns of FIGS. 9 and 10;

FIG. 12 illustrates a table indicative of the relationship between rows of FIGS. 9 and 10;

DETAILED DESCRIPTION OF THE PREFERRED EMBODIMENT

Figure 13:
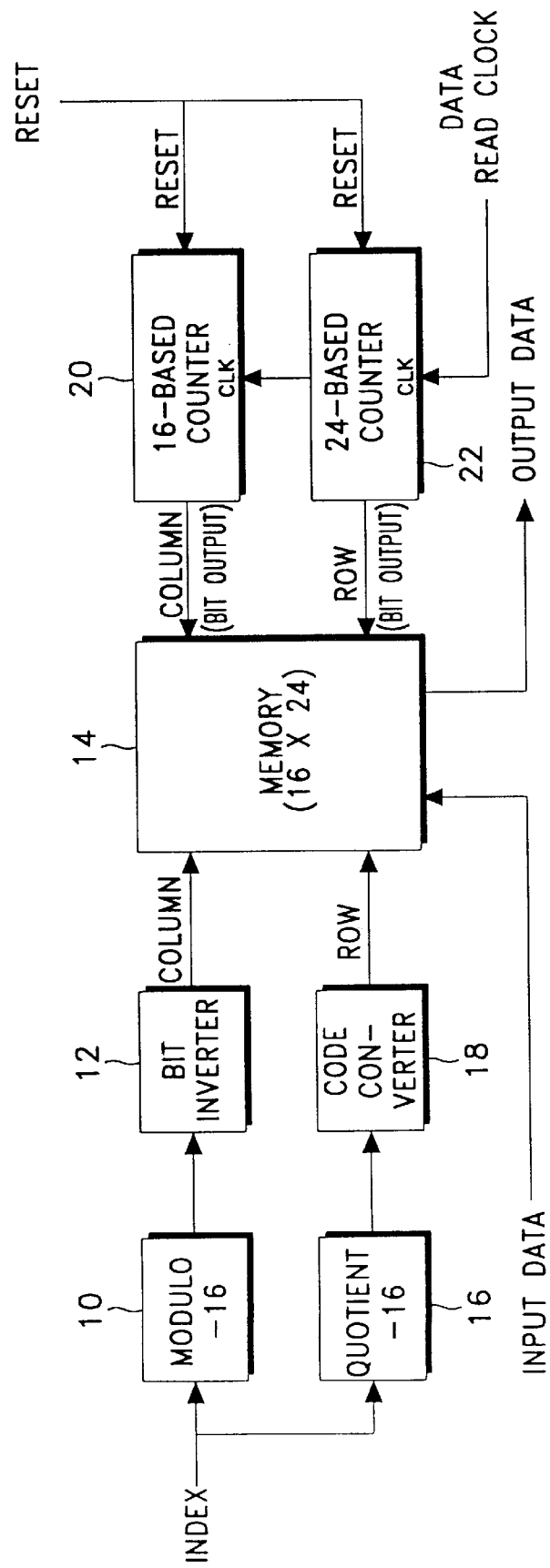
FIG. 13 is a schematic block diagram for a base-band interleaver constructed according to a preferred embodiment of the present invention.

Referring now to the drawings and particularly to FIG. 1, which illustrates an exemplary input table of 14400 Bps, 9600 Bps, 7200 Bps, 3600 Bps and 1800 Bps for a forward traffic and paging channel interleaver for use in a CDMA mobile telecommunication system defined in accordance with the IS-95 standard.

As shown in FIG. 1, the input table consists of 24 rows and 16 columns in matrix, fixing the data transmission speed inputted to the input table to 9600 Bps. Therefore, a sequential input of data in 9600 Bps of transmission speed is carried out from a first position, row 1 and column 1, of the matrix to its last position, row 24 and column 16, in which a respective index is assigned according to the order of the input data. For example, an index 1 represents a first input data to the input table and an index 2 represents its second input data. Likewise, it is noted in the input table that an address of index 1 corresponds to row 1 and column 1, an address of index 2 to row 2 and column 1, an address of index 3 to row 3 and column 1, and an address of index 4 to row 4 and column 1. Data recorded in these addresses are delivered to the interleaver according to the index order, in which the interleaver interleaves the input data to be written into a memory.

Figure 2:
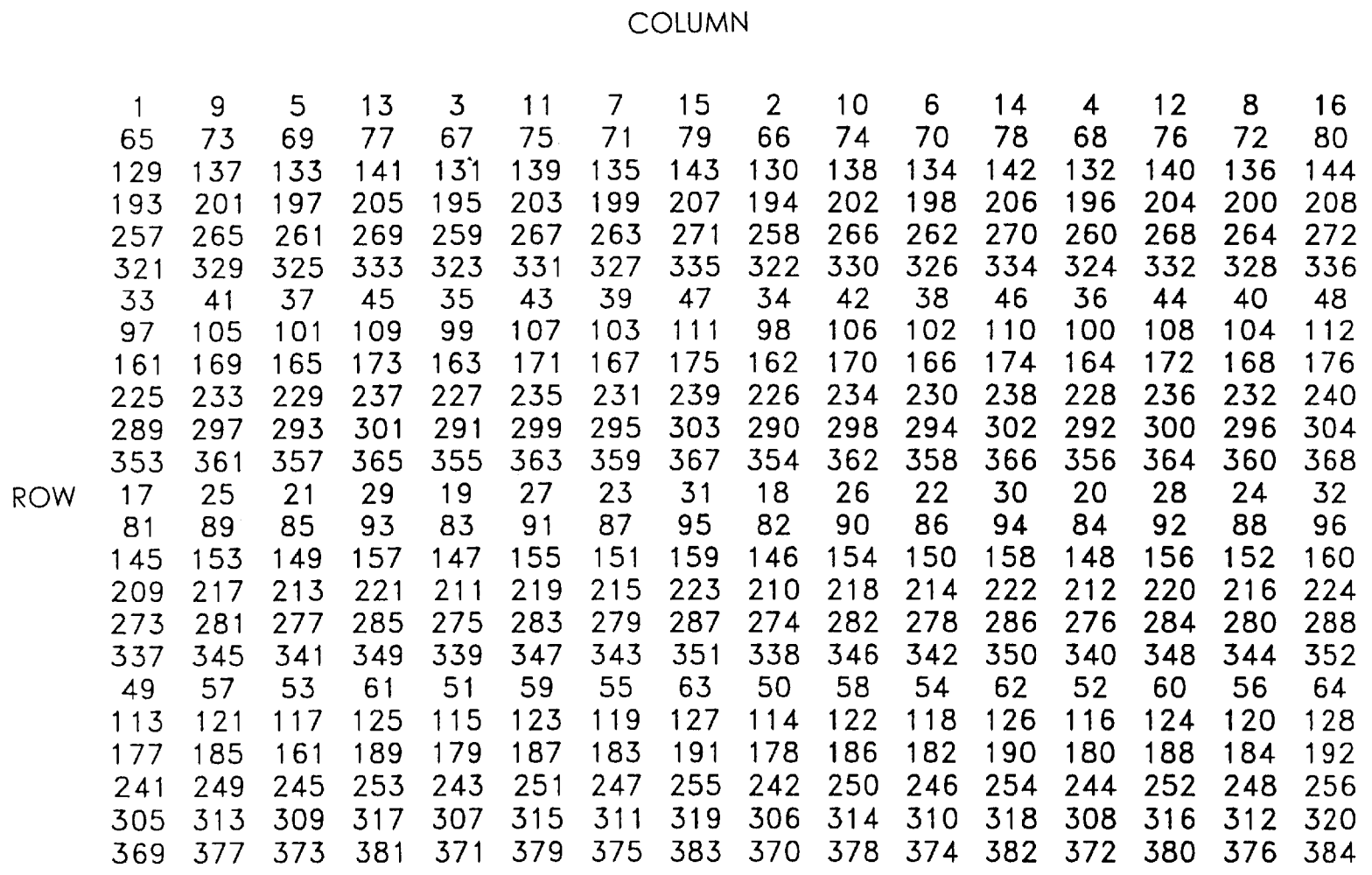

FIG. 2 illustrates an exemplary interleaving table, written in the memory, of 14400 Bps, 9600 Bps, 7200 Bps, 3600 Bps and 1800 Bps for the forward traffic and paging channel interleaver. The interleaving table has the same structure as that of the input table of FIG. 1, and consists of 24 rows and 16 columns of matrix table, setting its data transmission speed to 9600 Bps. In the interleaving table, data index is arranged so that an index 1 is positioned in row 1 and column 1, an index 2 in row 1 and column 9, and an index 3 in row 1 and column 5, in which arrangement the data indexing of the interleaving table is carried out dispersedly rather than sequentially.

FIG. 3 illustrates an exemplary input table of 4800 Bps for the forward traffic and paging channel interleaver, which has a transmission speed twice lower than that of 9600 Bps, but has been designed so as to be applicable to the data of 9600 Bps of transmission speed. Thus, a single 4800 Bps data is positioned in two successive addresses of the input table, so that these two indexes make one data index. For example, as seen in FIG. 3, the index of the first data is represented in two indexes "1". Therefore, the interleaver makes interleaving of the data positioned in the input table at 9600 Bps transmission speed, during which time the interleaver separately recognizes those two successive indexes representing one data.

FIG. 4 illustrates an exemplary interleaving table of 4800 Bps for the forward traffic and paging channel interleaver as an interleaving output of the interleaver of FIG. 3. As shown in FIG. 4, two distant indexes are separately interleaved. For example, the first index 1 is interleaved into a position of row 1 and column 1 and the second index 1 is then interleaved to another position of row 1 and column 9 by the interleaver.

FIG. 5 illustrates an exemplary input table of 2400 Bps for the forward traffic and paging channel interleaver, which has a transmission speed four times lower than that of 9600 Bps, but has been designed so as to be applicable to the data of 9600 Bps of transmission speed. Thus, one 2400 Bps data extends through four successive addresses of the input table, so that these four sequential indexes make one data index. For example, as seen in FIG. 5, the index of the first data is represented in four indexes "1". Therefore, the interleaver makes interleaving of the data positioned in the input table at 9600 Bps transmission speed, during which time the interleaver separately recognizes those four successive indexes representing one data.

Figure 6:
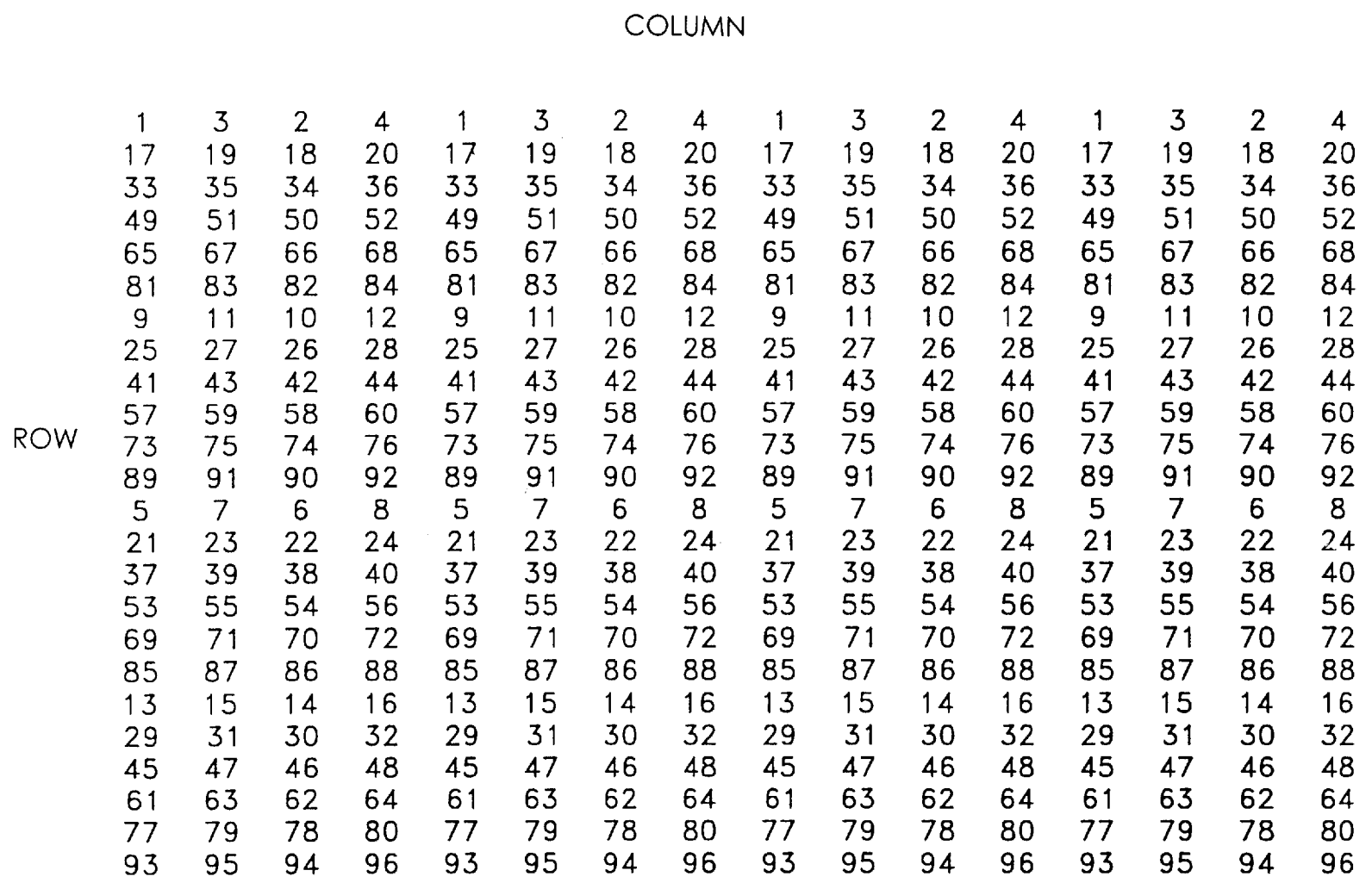

FIG. 6 illustrates an exemplary interleaving table of 2400 Bps for the forward traffic and paging channel interleaver as an interleaving output of the interleaver of FIG. 5. As shown in FIG. 6, four successive indexes are separately interleaved. For example, the first index 1 is interleaved to the position of row 1 and column 1, the second index 1 to the position of row 1 and column 9, the third index 1 to the position of row 1 and column 5, and the fourth index 1 to the position of row 1 and column 13 by means of the interleaver.

FIG. 7 illustrates an exemplary input table of 1200 Bps for the forward traffic and paging channel interleaver, which has a transmission eight times lower than that of 9600 Bps, but has been designed so as to be applicable to the data of 9600 Bps of transmission speed. Thus, one 1200 Bps data extends through eight successive addresses of the input table, so that these eight sequential indexes make one data index. Hence, for example, as seen in FIG. 7, the index of the first data may be represented in eight indexes "1". Therefore, the interleaver makes interleaving of the data positioned in the input table at 9600 Bps transmission speed, during which time the interleaver separately recognizes those eight successive indexes representing one data.

FIG. 8 illustrates an exemplary interleaving table of 1200 Bps for the forward traffic and paging channel interleaver as an interleaving output of the interleaver of FIG. 7. As shown in FIG. 8, eight successive indexes are separately interleaved. For example, the first index 1 is interleaved to the position of row 1 and column 1, the second index 1 to the position of row 1 and column 9, the third index 1 to the position of row 1 and column 5, the fourth index 1 to the position of row 1 and column 13, the fifth index 1 to the position of row 1 and column 3, the sixth index 1 to the position of row 1 and column 11 index 1 to the position of row 1 and column 7, and the eighth index 1 to the position of row 1 and column 15 by means of the interleaver.

As described, the interleaving operation is carried out at a fixed 9600 Bps transmission speed in spite of difference of data transmission speeds. Therefore, it is noted that the index is not generated in data unit, but generated in 9600 Bps data unit for all the data. If the input data having the above indexes are inputted to the interleaver capable of interleaving at the 9600 Bps transmission speed, then the various transmission speeds of data could be interleaved by using a single interleaver.

Typical interleavers for forward traffic and paging channel in a base-band defined in accordance with the IS-95 CDMA standard utilize a memory look-up table, which is a reference table by which each index of the input data is interleaved to its corresponding address on the interleaving table. Therefore, as an index of one input data to interleave is provided to the interleaver, the interleaver reads the corresponding address on the interleaving table to thereby store the read data onto the address. For example, if the data of index 1 is inputted, then the position of row 1 and column 1 of the interleaving table corresponding to the index 1 is read out to thereby store the data of the index 1 in the same position. This kind of interleaving method generally does not require complicated operation, but requires memories to store therein such a look-up table for interleaving.

Moreover, most interleavers for forward traffic and paging channel in a base-band defined in accordance with the IS-95 CDMA standard are preferably provided with a general-purpose memory of 512 bytes for the look-up table. However, as I have described earlier, the look-up table usually requires only 384 bytes of the 512-byte memory chip, the remaining 128 bytes of memory may become wasteful.

Turning now to an interleaver for forward traffic and paging channel in a base-band for use in an IS-95 CDMA mobile telecommunication system as contemplated by the present invention. The interleaver is intended to perform interleaving on basis of 9600 Bps input data. Thus, an interleaver of a preferred embodiment of the present invention is adopting an input table and an interleaving table generated on basis of the above 9600 Bps signal.

FIG. 9 illustrates an input table of the input data according to the preferred embodiment of the present invention, while FIG. 10 illustrates an interleaving table according to the preferred embodiment. Both input table and interleaving table are provided 384 bits, indexes of which are referred to as index 0 to index 383. Further, rows and columns of the input table and interleaving table are referred to as row 0 to row 23 and column 0 to 15, respectively. The input table is provided with 384 indexes which are arranged in sequence from an index 0 of row 0 and column 0 up to an index 383 of row 23 and column 15, as shown in FIG. 9. Likewise, the interleaving table is provided with 384 indexes which are arranged in sequence from an index 0 of row 0 and column 0 up to an index 383 of row 23 and column 15, as shown in FIG. 10.

Referring to the input table as shown in FIG. 9, and interleaving table as shown in FIG. 10, the following relation can be appreciated. That is to say, if any index of the output table is to be divided by a numeral 16, its remainder is then represented in four bits, and these four bits are taken by bit-inversion, then it corresponds to a particular column where the above index is positioned in the interleaving table. Here, the bit-inversion could be usually provided by conversion of the bit position as indicated in the following table.

TABLE

| | | | | |
|---|---|---|---|---|
| Before Bit-inversion | Bit 0 | Bit 1 | Bit 2 | Bit 3 |
| After Bit-inversion | Bit 3 | Bit 2 | Bit 1 | Bit 0 |

Referring to the table, the bit-inversion is performed such that bit 0 is replaced by bit 3, bit 1 by bit 2, bit 2 by bit 1, and bit 3 by bit 0.

FIG. 11 illustrates the exemplary way of obtaining columns of the interleaving table by using the above-mentioned index, in which the columns of index 0 through index 15 obtained are set forth. As this index is divided by a numeral 16, its remainder can be taken as modulo-16, which can be then represented in four bit format, thereby making modulo bits. The modulo bits are then inverted according to the above table to perform the bit-inversion, by which a column indicated by the inverted bit corresponds to a selected column of the interleaving table. For example, if the modulo-16 of the index 0 is zero, then the modulo bit is 0000, the bit inversion is 0000, and a column of the interleaving table is 0. This means that when data of index 0 of the input table is interleaved, the data of index 0 is positioned in column 0 of the interleaving table. Similarly, it will be appreciated that the modulo-16 of the index 1 is 1, the modulo bit is 0001, the bit inversion is 1000, and a column of the index 1 in the interleaving table is column 8. Thus, it means that when data of index 1 of the input table is interleaved, the data of index 1 is positioned in column 8 of the interleaving table. As a result, it is noted that respective columns of those indexes of the input table and the interleaving table are matched to each other one by one by a simple operation.

In the meanwhile, the relation between indexes of the input table and rows of the interleaving table is described hereinafter, with reference to FIGS. 9 and 10. When the index is divided by 16, its quotient is taken as a quotient-16. In order to obtain a row from the above quotient-16, the present invention uses a row table as set forth in FIG. 12 since it is not possible to find any relationship between the quotient-16 and the rows by using any simple operation. For example, the row table of FIG. 12 is arranged such that if the quotient-16 is zero, then the row becomes row 0, if the quotient-16 is 1, then the row becomes row 12, if the quotient-16 is 2, then the row becomes row 6, and likewise, if the quotient-16 is 23, then the row becomes row 23.

Accordingly, in case that the quotient-16 is zero, the indexes will be 0, 1, 2, - - - 14, 15, which are located in row 0 as shown in the interleaving table of FIG. 10. Further, in case that the quotient-16 is 1, the indexes will be 16, 17, 18 - - - 30, 31. As above described, those rows of the row table of FIG. 12 and the rows corresponding to the quotient-16 are identical to each other. Here, the row table can be embodied by much smaller size of memory, for example, 24 bytes, as compared to a larger size of memory, for example, 512 bytes needed upon using a general purpose memory.

Refer now to FIG. 13 which illustrates a base-band interleaver constructed according to a preferred embodiment of the present invention with correlation of indexes. As shown in FIG. 13, the base-band interleaver includes a modulo-16 10, a bit inverter 12, a memory 14, a quotient-16 16, a code converter 18, a 16-based counter 20, a 24-based counter 22.

Modulo-16 circuit 10 of the interleaver receives the index, which is divided by 16, and then provides its remainder to a bit invertor 12. This bit invertor makes bit-inversion of an input modulo-16 value from the modulo-16 circuit, which bit inverted value corresponds to a given column on the interleaving table. This column is inputted to a memory 14 having therein the interleaving table as shown in FIG. 10.

Quotient-16 circuit 16 of the interleaver also receives the index, which is divided by 16, and then provides its divided quotient to a code converter 18 having the column table as shown in FIG. 11. Accordingly, the code converter 18 reads out a column corresponding to the above quotient from the column table and then provides the read column to the memory 14. Thus, the memory receives both of the column and the row, by which the memory writes the input data into a particular position according to these row and column.

In the meantime, a main system (not shown) provides a data read clock, which is delivered to a 24-based counter 22, when it requires to output the data written in the memory by the above interleaving operation. The 24-based counter 22 makes count of the input data clock to therefrom provide a counted value, which indicates a selected row of the interleaving table in the memory 14.

Further, a carry provided from the 24-based counter is then delivered to a 16-based counter 20, which makes a count of the carry and provides the counted value to the memory 14. This counted value represents a selected column of the interleaving table. Therefore, the memory 14 receives the above row and column and in response thereto, provides data of a corresponding position as an output.

As apparent from the foregoing description, the present invention provides a base-band interleaver utilizing the correlation between index positions of the interleaving table in case the indexes of data are written by interleaving. Further, in case of being written by interleaving with the indexes of data having no correlation, the position in the interleaving table is sought by using a simple small-capacity code converter. As a result, the present invention requires a much smaller capacity of memory, for example, only 24 bytes or so, for a base-band interleaver, as compared to contemporary interleavers which usually require at least 384 bytes of memory capacity. Hence, the base-band interleaver can be constructed with lower production cost than that of any contemporary interleavers.

Figure 14:
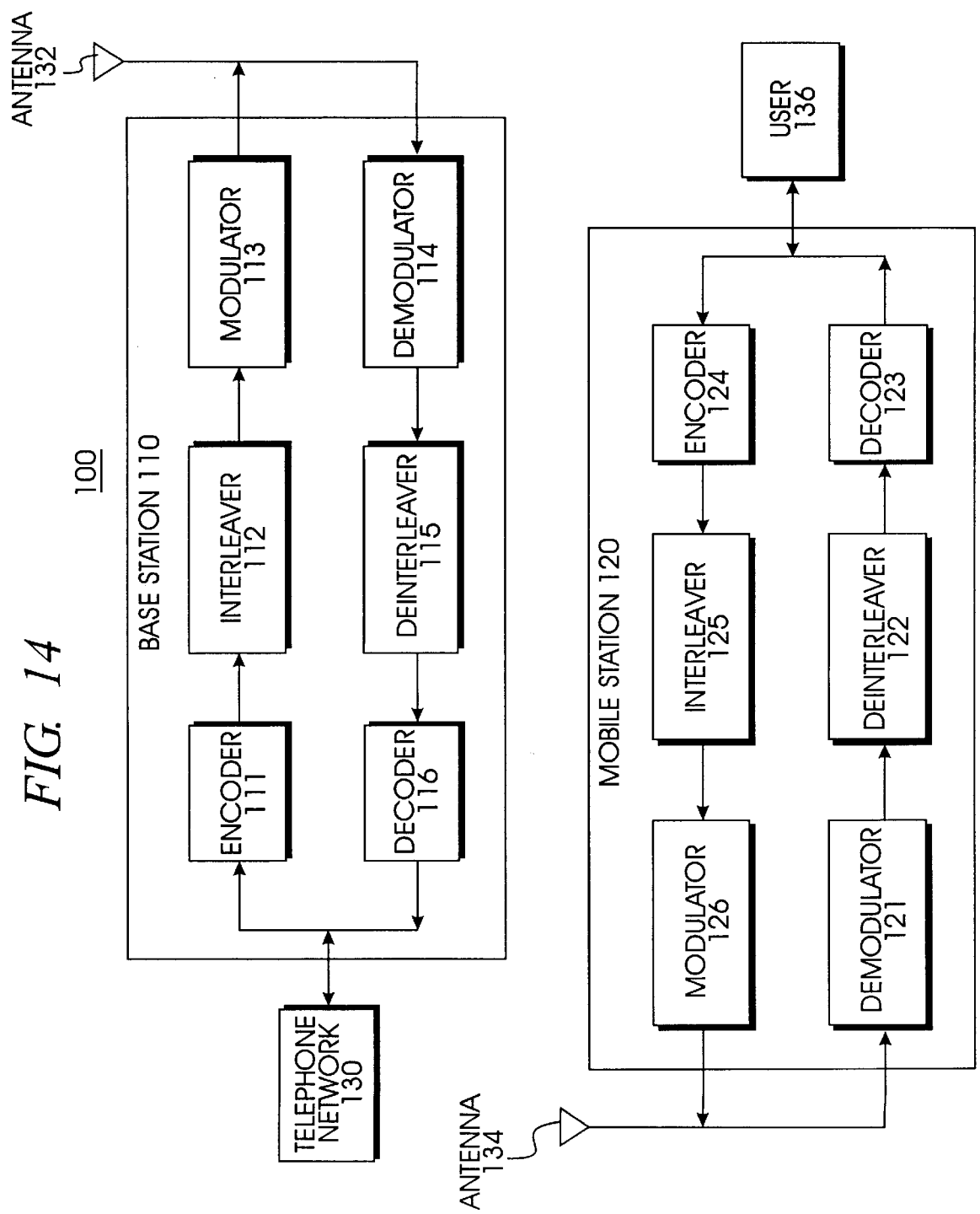
FIG. 14 is a schematic block diagram of a CDMA mobile telecommunication system utilizing the base-band interleaver constructed according to the preferred embodiment of the present invention.

FIG. 14 is a schematic block diagram of a CDMA mobile telecommunication system utilizing the base-band interleaver constructed according to the preferred embodiment of the present invention. That is, the base-band interleaver as shown in FIG. 13 may be incorporated into the CDMA mobile telecommunication system 100 which includes a base station 110 and one or more mobile stations 120. Base station 110 includes an encoder 111, a base-base interleaver 112 as shown in FIG. 13, a modulator 113, a demodulator 114, a deinterleaver 115 which is constructed similarly to the interleaver as shown in FIG. 13 only to perform the inverse operation, and a decoder 116. Mobile station 120 includes a demodulator 121, a deinterleaver 122 similar to that of the base station 110, a decoder 123, an encoder 124, an interleaver 125 similar to that of the base station 110, and a modulator 126.

Base station 110 receives data from a telephone network 130. The network data is encoded by encoder 111, and then interleaved by interleaver 112 by operations as described with reference to FIG. 13 in accordance with IS-95 standard. Such interleaving provides protection against burst errors by spreading out, or randomizing, errors that occur in short burst of time. The interleaved data from interleaver 112 is then modulated in a conventional modulator 113 and transmitted via an antenna 132 in the radio frequency (RF) domain. Mobile station 120 receives the transmitted data from the base station 110 via an antenna 134. The received data is demodulated by a conventional demodulator 121, and is deinterleaved by deinterleaver 122 and decoded by decoder 123. The decoded and deinterleaved data is output to a user 136.

Transmission from mobile station 120 to base station 110 occurs in the same fashion. Mobile station 120 receives data from the user 136 for encoding via encoder 124, interleaving via interleaver 125, and then modulation via modulator 126 for transmission via antenna 134. Base station 110, in turns, receives the transmitted data from the mobile station 120 for demodulation via demodulator 114, deinterleaving via deinterleaver 115, and then decoding via decoder 116. The decoded and interleaved data is output to telephone network 130.

As contemplated by the present invention, the interleaving process performed by those base-band interleavers in the manner described with reference to FIG. 13 which utilize the correlation between index positions of the interleaving table in case the indexes of data are written by interleaving. When the indexes of data having no correlation, the position in the interleaving table is sought by using a simple small-capacity code converter. As a result, a much smaller capacity of memory, for example, only 24 bytes or so, is required for a base-band interleaver, and a simpler circuit construction is provided to minimize production cost.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A base-band interleaver, comprising:

a modulo-16 circuit for dividing an index by a numeral 16, said index being a selected one of a plurality of successive indexes 0 to 383 corresponding to input data, and providing a remainder of dividing of the index;

a bit invertor for making bit inversion of an output from the modulo-16 circuit and determining a column position to write in the data with interleaving taken;

a quotient-16 circuit for receiving the index to produce a quotient of dividing of the index by the numeral 16;

a code converter having a row table by which said quotient is respectively matched to a row position to be written with interleaving taken, for generating a row position corresponding to the quotient;

a 24-based counter for making a count of a data read clock and thereby providing a 24-based counted value corresponding to a selected row of output data to read out, so as to output the interleaved written data selectively;

a 16-based counter receiving a carry of the 24-based counter, for providing a 16-based counted value corresponding to a selected column of output data to read out; and a memory having therein an interleaving table inclusive of 32 rows and 16 columns, said input data being written to a selected position of said interleaving table according to an output of the bit invertor and an output of the code converter, said output data being data read out from a position corresponding to the output of said 16-based counter and the output of said 24-based counter.

* * * * *